United States Patent
Luo et al.

(10) Patent No.: US 8,848,462 B2
(45) Date of Patent: Sep. 30, 2014

(54) LOW POWER MEMORY CONTROLLERS

(75) Inventors: Yan-Bin Luo, Taipei (TW); Chih-Chien Hung, Hualien (TW); Qui-Ting Chen, Sanchong (TW); Shang-Ping Chen, Tai-Chung (TW)

(73) Assignee: Mediatek Inc., Hsin-Chu (TW)

( * ) Notice: Subject to any disclaimer, the term of this patent is extended or adjusted under 35 U.S.C. 154(b) by 120 days.

(21) Appl. No.: 13/617,394

(22) Filed: Sep. 14, 2012

(65) Prior Publication Data

US 2013/0088929 A1    Apr. 11, 2013

Related U.S. Application Data

(60) Provisional application No. 61/545,740, filed on Oct. 11, 2011.

(51) Int. Cl.
*G11C 7/10* (2006.01)
*G06F 13/16* (2006.01)
*G11C 8/06* (2006.01)

(52) U.S. Cl.
CPC .............. *G06F 13/16* (2013.01); *G11C 7/1051* (2013.01); *G11C 8/06* (2013.01); *G11C 7/1078* (2013.01)
USPC ................... 365/189.05; 365/63; 365/230.06

(58) Field of Classification Search
CPC ........ G06F 13/16; G11C 7/1051; G11C 8/06; G11C 8/107
USPC .............. 365/189.05, 51, 63, 230.06, 230.08, 365/226, 185.11
See application file for complete search history.

(56) References Cited

U.S. PATENT DOCUMENTS

| 6,125,419 | A  | * | 9/2000  | Umemura et al. | 710/110 |
| 6,160,417 | A  | * | 12/2000 | Taguchi | 326/30 |
| 6,209,071 | B1 | * | 3/2001  | Barth et al. | 711/167 |
| 6,963,218 | B1 | * | 11/2005 | Alexander et al. | 326/30 |
| 7,012,449 | B2 | * | 3/2006  | Lee et al. | 326/82 |
| 8,335,115 | B2 | * | 12/2012 | Lee | 365/189.05 |

* cited by examiner

*Primary Examiner* — Gene Auduong
(74) *Attorney, Agent, or Firm* — McClure, Qualey & Rodack, LLP

(57) ABSTRACT

A memory controller is provided. The memory controller is powered by first and second power source and includes an input/output pin, a driver circuit, a terminal resistor, and an input buffer. The driver circuit is coupled to the input/output pin and capable of providing to a writing signal to the input/output pin. The terminal resistor is coupled between the input/output pin and the first power source. The input buffer is coupled to the input/output pin and capable of receiving a reading signal from the input/output pin. No terminal resistor is coupled between the input/output pin and the second power source.

11 Claims, 2 Drawing Sheets

LOW POWER MEMORY CONTROLLERS

CROSS REFERENCE TO RELATED APPLICATIONS

This application claims the benefit of U.S. Provisional Application No. 61/545,740, filed on Oct. 11, 2011, the contents of which are incorporated herein by reference.

BACKGROUND OF THE INVENTION

1. Field of the Invention

The invention relates to a memory controller, and more particularly to a low power DDR memory controller.

2. Description of the Related Art

Generally, in a double data rate (DDR) memory system, such as a DDR dynamic random access memory (DRAM) system, each of a main die comprising a memory controller and a memory device comprising a DRAM device has one set of two terminal resistors coupled in series between a respective operation voltage and ground voltage for one input/output (I/O) pin of a bi-directional transmitter, and the joint point between the two terminal resistors is coupled to the I/O pin. For each of the main die and the memory controller, a respective on-die termination (DOT) voltage is equal to a half of the respective operation voltage. In this structure, static power dissipation occurs. For example, in a DRAM system with a series DDR3 1.5V/240Ω, there is a static current of 6.25 mA per one bit for each of the read and write paths. In a DRAM system with a series DDR2 1.8V/30Ω, there is a static current of 6 mA per one bit for each of read and write paths. In recent years, low power is required for DRAMs. Thus, static current induced in a DRAM system may be decreased to achieve the low power requirement.

Thus, it is desired to provide a low power memory controller which induces a low static current.

BRIEF SUMMARY OF THE INVENTION

An exemplary embodiment of a memory controller is powered by a first power source and a second power source. The memory controller comprises an input/output pin, a driver circuit, a terminal resistor, and an input buffer. The driver circuit is coupled to the input/output pin and capable of providing to a writing signal to the input/output pin. The terminal resistor is coupled between the input/output pin and the first power source. The input buffer is coupled to the input/output pin and capable of receiving a reading signal from the input/output pin. No terminal resistor is coupled between the input/output pin and the second power source.

An exemplary embodiment of a memory system comprises a memory controller and a memory device. The memory controller is packaged in a first die, and the memory device is packaged in a second die. The memory controller is powered by a first power source and a second power source. The memory controller comprises a first input/output pin, a first driver circuit, a first terminal resistor, and a first input buffer. The first driver circuit is coupled to the first input/output pin and capable of providing to a writing signal to the first input/output pin. The first terminal resistor is coupled between the first input/output pin and the first power source. The first input buffer is coupled to the first input/output pin and capable of receiving a reading signal from the first input/output pin. No terminal resistor is coupled between the input/output pin and the second power source. The memory device comprises a second input/output pin, a memory array, a controlling circuit, a second driver circuit, and a second input buffer. The second input/output pin is coupled to the first input/output pin. The memory array is capable of storing data. The controlling circuit is capable of accessing the memory array. The second driver circuit is coupled to the second input/output pin. The controlling circuit is capable of reading data from the memory array to generate the reading signal. The second driver circuit is capable of driving the reading signal and providing the driven reading signal to the second input/output pin. The second input buffer is coupled to the second input/output pin. The second input buffer is capable of receiving the writing signal from the second input/output pin and buffing the writing signal to the controlling circuit. The controlling circuit is capable of writing data to the memory array according to the writing signal.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
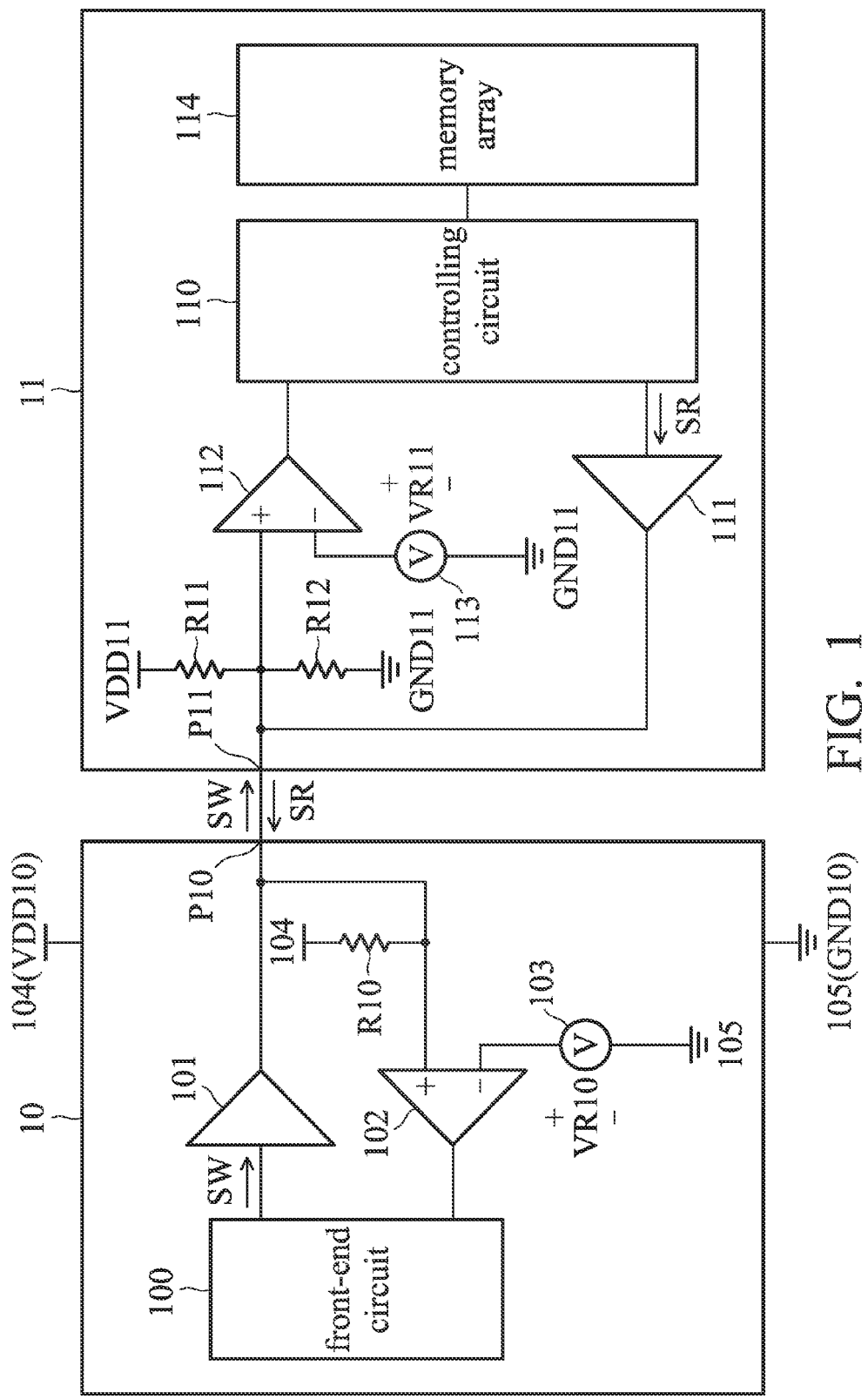
FIG. 1 shows an exemplary embodiment of a memory system.

The following description is of the best-contemplated mode of carrying out the invention. This description is made for the purpose of illustrating the general principles of the invention and should not be taken in a limiting sense. The scope of the invention is best determined by reference to the appended claims.

Memory systems are provided. In an exemplary embodiment shown in FIG. 1, a memory system 1 comprises a memory controller 10 and a memory device 11. In the embodiment, the memory system 1 is a double data rate (DDR) dynamic random access memory (DRAM) system. The memory controller 10 (such as an DRAM controller) and the memory device (such as a DRAM device) 11 are packaged separately. For example, the memory controller 10 is packaged in one die serving a main die, and the memory device 11 is packaged in the other die serving memory die. The memory controller 10 is powered by two power sources 104 and 105. One power source 104 provides an operation voltage VDD10 of the memory controller 10, and the other power source 105 provides a ground voltage GND10 of the memory controller 10. An input/output (I/O) pin P10 of the memory controller 10 is coupled to an I/O pin P11 of the memory device 11 through a transmission line 12. The memory controller 10 comprises a front-end circuit 100, a driver circuit 101, an input buffer 102, a voltage source 103, and a terminal resistor R10. An input terminal of the driver circuit 101 is coupled to the front-end circuit 100, and an output terminal thereof is coupled to the I/O pin P10. A positive input terminal of the input buffer 102 is coupled to the I/O pin P10. The voltage source 103 is coupled between a negative input terminal of the input buffer 102 and the power source 105 (ground voltage GND10). The terminal resistor R10 is coupled between the power source 104 (operation voltage VDD10) and the I/O pin P10. An output terminal of the input buffer 102 is coupled to the front-end circuit 100. According to the structure of the memory controller 10, the input buffer 102 is merely coupled to the power source 104 through the terminal resistor R10 in the respective die, and there is no resistor coupled between the I/O pin P10 and the power source 105. In other words, the input buffer 102 is merely coupled to the operation voltage VDD10 through the terminal resistor R10 in the respective die, and the input buffer 102 is not coupled to the ground voltage GND10 through a resistor in the respective die.

The memory device 11 comprises a controlling circuit 110, a driver circuit 111, an input buffer 112, a voltage source 113, and a memory array 114, and terminal resistors R100. An input terminal of the driver circuit 111 is coupled to the controlling circuit 110, and an output terminal thereof is coupled to the I/O pin P11. A positive input terminal of the input buffer 112 is coupled to the I/O pin P11. The voltage source 113 is coupled between a negative input terminal of the input buffer 112 and a ground voltage GND11 of the memory device 11. The terminal resistor R11 is coupled between an operation voltage VDD11 of the memory device 11 and the I/O pin P11. The terminal resistor R12 is coupled between the I/O pin P11 and the ground voltage GND 11. An output terminal of the input buffer 112 is coupled to the controlling circuit 110. According to the structure of the memory device 11, the input buffer 112 is coupled to not only the operation voltage VDD11 through the terminal resistor R11 but also the ground voltage GND11 through the terminal resistor R12. The voltage source 113 provides a voltage VR11 (also called "on-die termination (DOT) voltage") which is equal to a half of the operation voltage VDD11. In the embodiment, the operation voltage VDD10 of the memory controller 10 is equal to the operation voltage VDD11 of the memory device 11, and the ground voltage GND10 of the memory controller 10 is equal to the ground voltage GND11 of the memory device 11. In the embodiment, each of the terminal resistors R11 and R12 is a pseudo open drain terminator of the memory device 11.

Referring to FIG. 1, when the memory system 1 performs a writing operation. The front-end circuit 100 generates a writing signal SW to the driver circuit 101. The driver circuit 101 drives the writing signal SW and provides the driven writing signal SW to the transmission line 12 via the I/O pin P10. The input buffer 112 of the memory device 11 receives the writing signal SW via the I/O pin P11. The input buffer 112 buffers the writing signal SW to the controlling circuit 110. The controlling circuit 110 performs an accessing operation to write data to the memory array 114 according to the writing signal SW. Accordingly, the driver circuit 101 of the memory controller 10, the transmission line 12, and the input buffer 112 of the memory device 11 form a writing path.

When the memory system 1 performs a reading operation, when controlling circuit 110 performs the accessing operation to read data from the memory array 114. The controlling circuit 110 generates a reading signal SR. The driver circuit 111 drives the reading signal SR and provides the driven reading signal SR to the transmission line 12 via the I/O pin P11. The input buffer 102 of the memory controller 10 receives the reading signal SR via the I/O pin P10. The input buffer 102 buffers the reading signal SR to the front-end circuit 100. Accordingly, the driver circuit 111 of the memory device 11, the transmission line 12, and the input buffer 102 of the memory controller 10 form a reading path.

In the embodiment, the terminal resistor R10 is a pseudo open drain terminator of the memory controller 10. Based on the structure of FIG. 1, the memory controller 10, a voltage VR10 (also called "on-die termination (DOT) voltage") provided by the voltage source 103 is determined according to the resistance of the terminal resistor R10. The voltage VR10 is larger than a half of the operation voltage VDD10 (VR10>½×VDD10). In a preferred embodiment, the voltage VR10 is equal to 0.7 times of the operation voltage VDD10 (VR10=0.7×VDD10). Referring to FIG. 1, there is only one terminal resistor R10 coupled to the I/O pin P10 and the positive input terminal of the input buffer 102, that is, the input buffer 102 is merely coupled to the power source 104 (the operation voltage VDD10) through the terminal resistor R10. Thus, the static current induced in the reading path is decreased. Particularly, when the resistance of the terminal resistor R10 is 60Ω, there is no the static current in the reading path.

Figure 2:
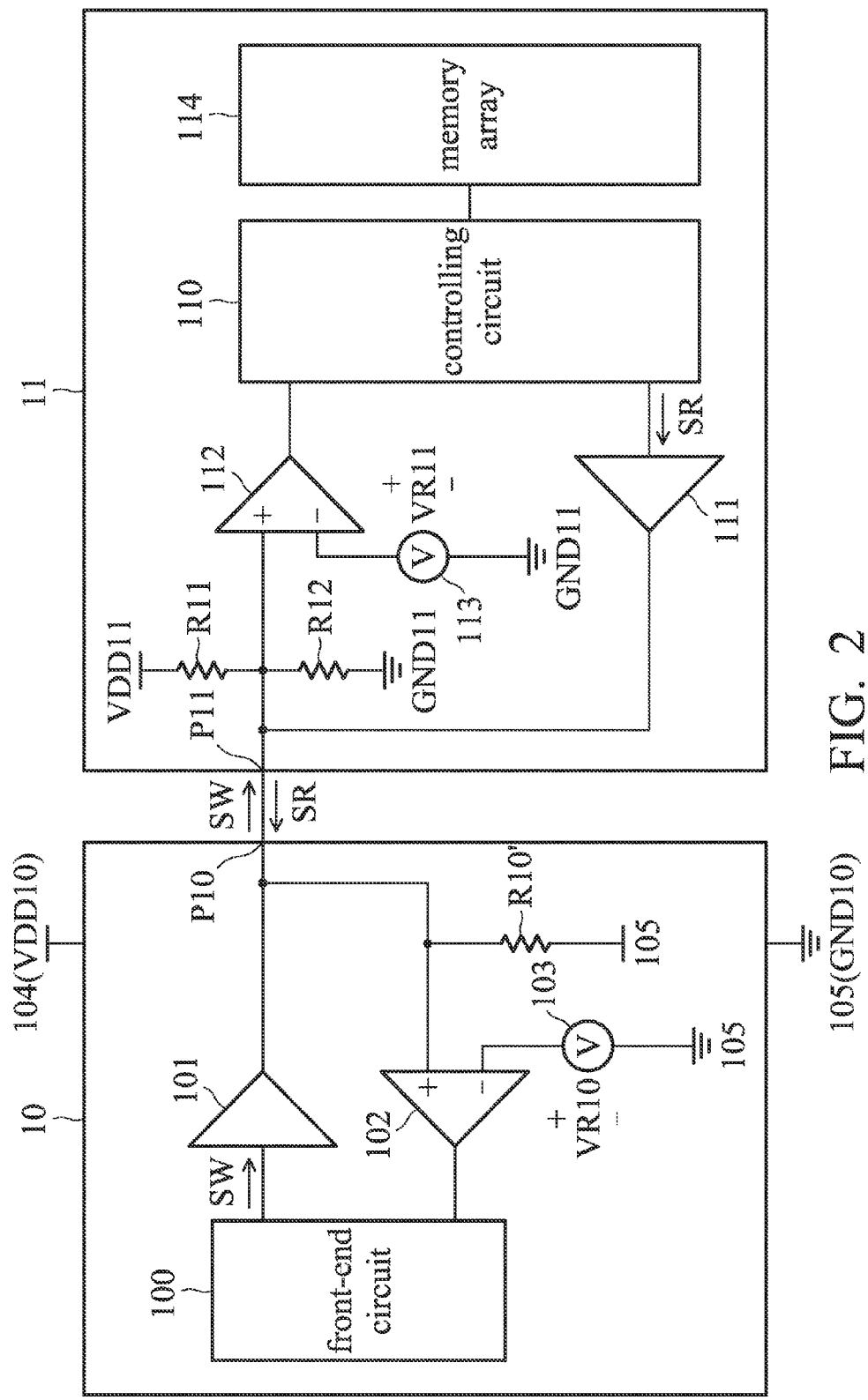
FIG. 2 shows an exemplary embodiment of a memory system.

In some embodiments, the terminal resistor of the memory controller 10 is coupled between the between the I/O pin P10 and the power source 105. As shown in FIG. 2, a terminal resistor R10' is coupled between the between the I/O pin P10 and the power source 105 (the ground voltage GND10). In this structure of FIG. 2, the voltage VR10 provided by the voltage source 103 is less than a half of the operation voltage VDD10 (VR10<½×VDD10). In a preferred embodiment, the voltage VR10 is equal to 0.3 times of the operation voltage VDD10 (VR10=0.3×VDD10). Referring to FIG. 2, the input buffer 102 is merely coupled to the power source 105 through the terminal resistor R10', and there is no resistor coupled between the I/O pin P10 and the power source 104. In other words, the input buffer 102 is merely coupled to the ground voltage GND10 through the terminal resistor R10' in the respective die, and the input buffer 102 is not coupled to the operation voltage VDD10 through a resistor in the respective die. The static current induced in the reading path is decreased. Particularly, when the resistance of the terminal resistor R10' is 60Ω, there is no the static current in the reading path.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A memory system comprising:
a memory controller packaged in a first die and powered by a first power source and a second power source, wherein the memory controller comprises:
a first input/output pin;
a first driver circuit, coupled to the first input/output pin, for providing to a writing signal to the first input/output pin;
a first terminal resistor coupled between the first input/output pin and the first power source; and
a first input buffer, coupled to the first input/output pin, for receiving a reading signal from the first input/output pin;
wherein the first terminal resistor is disposed on the inside of the first die, no terminal resistor is coupled between the first input/output pin and the second power source;
a memory device packaged in a second die and comprising:
a second input/output pin coupled to the first input/output pin;
a memory array for storing data;
a controlling circuit for accessing the memory array;
a second driver circuit coupled to the second input/output pin, wherein the controlling circuit reads data from the memory array to generate the reading signal, and the second driver circuit drives the reading signal and provides the driven reading signal to the second input/output pin; and
a second input buffer, coupled to the second input/output pin, for receiving the writing signal from the second input/output pin and buffing the writing signal to the controlling circuit, wherein the controlling circuit writes data to the memory array according to the writing signal.

2. The memory system as claimed in claim 1, wherein the first power source provides an operation voltage of the memory controller, and the second power source provides a ground voltage of the memory controller.

3. The memory system as claimed in claim 1, wherein the first power source provides a ground voltage of the memory controller, and the second power source provides an operation voltage of the memory controller.

4. The memory system as claimed in claim 1, wherein the memory controller further comprises a voltage source, wherein the first input buffer has a positive input terminal coupled to the first input/output pin and a negative input terminal coupled to the voltage source.

5. The memory system as claimed in claim 4, wherein the first power source provides an operation voltage of the memory controller, and the voltage source provides a voltage which is larger than a half of the operation voltage of the memory controller.

6. The memory system as claimed in claim 5, wherein the second power source provides a ground voltage of the memory controller, and the voltage source is coupled between the negative input terminal of the first input buffer and the second power source.

7. The memory system as claimed in claim 4, wherein the first power source provides a ground voltage of the memory controller, and the voltage source provides a voltage which is less than a half of an operation voltage of the memory controller.

8. The memory system as claimed in claim 7, wherein the second power source provides the operation voltage of the memory controller, and the voltage source is coupled between the negative input terminal of the second input buffer and the second power source.

9. The memory system as claimed in claim 1, wherein the first terminal resistor is a pseudo open drain terminator.

10. The memory system as claimed in claim 1, wherein the memory device further comprises:
   a second terminal resistor coupled between an operation voltage of the memory device and the second input/output pin; and
   a third terminal resistor coupled between the second input/output pin and a ground voltage of the memory device.

11. The memory system circuit as claimed in claim 10, wherein each of the second and third terminal resistors is a pseudo open drain terminator.

* * * * *